United States Patent [19]

McElroy et al.

[11] Patent Number: 5,334,550

[45] Date of Patent: Aug. 2, 1994

[54] METHOD OF PRODUCING A SELF-ALIGNED WINDOW AT RECESSED INTERSECTION OF INSULATING REGIONS

[75] Inventors: David J. McElroy, Rosenberg; Sung-Wei Lin, Houston; Manzur Gill, Rosharon, all of Tex.

[73] Assignee: Texas Instruments Incorporated, Dallas, Tex.

[21] Appl. No.: 4,813

[22] Filed: Jan. 15, 1993

Related U.S. Application Data

[60] Division of Ser. No. 637,390, Jan. 4, 1991, abandoned, which is a continuation of Ser. No. 295,079, Jan. 9, 1989, abandoned.

[51] Int. Cl.$^5$ .............................. H01L 21/76
[52] U.S. Cl. ............................... 437/65; 437/69; 437/70; 437/984
[58] Field of Search .............. 437/65, 69, 70, 924, 437/984; 148/DIG. 85, DIG. 86, DIG. 117

[56] References Cited

U.S. PATENT DOCUMENTS 5,028,559  7/1991  Zdebel et al.
5,120,675  6/1992  Pollack.

FOREIGN PATENT DOCUMENTS 63-31124  2/1988  Japan.

OTHER PUBLICATIONS

Woll, S., *Silicon Processing for the VLSI Era* vol. 2: Process Integration, Lattice Press 1990 pp. 20–23.

Primary Examiner—George Fourson
Attorney, Agent, or Firm—Theodore D. Lindgren; Leo N. Heiting; Richard L. Donaldson

[57] ABSTRACT

An integrated circuit structure and process relating to a self-aligned window at the recessed junction of two insulating regions formed on the surface of a semiconductor body. The window may include a trench forming an isolation region between doped semiconductor regions, or may include an electrical conductor connected to a doped semiconductor region, or may include an electrical conductor separated from doped semiconductor regions by an electrical insulator. Embodiments include, but are not limited to, a field-effect transistor, a tunnelling area for a floating gate transistor, and an electrical connection to a doped area of the substrate.

9 Claims, 2 Drawing Sheets

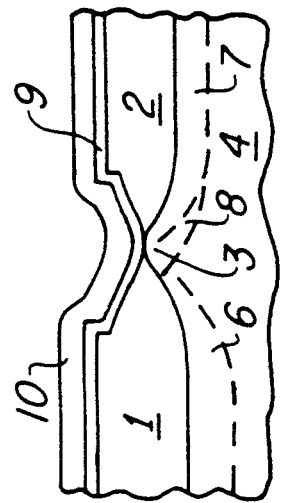
Fig. 1e
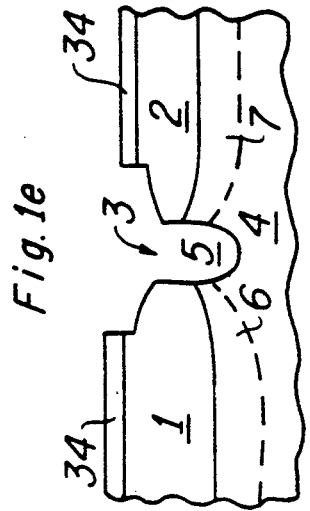
Fig. 1f
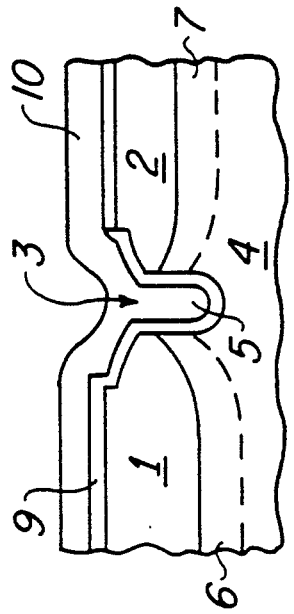
Fig. 1g
Fig. 1a
Fig. 1b
Fig. 1c
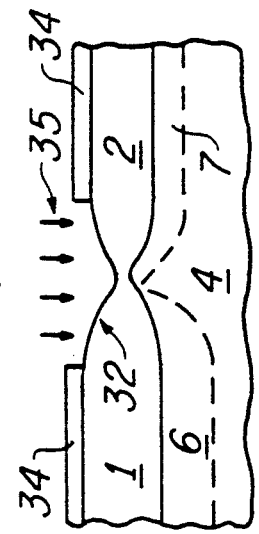
Fig. 1d
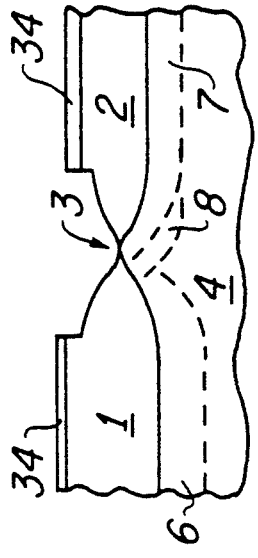

METHOD OF PRODUCING A SELF-ALIGNED WINDOW AT RECESSED INTERSECTION OF INSULATING REGIONS

CROSS REFERENCE TO RELATED APPLICATIONS

This application is a divisional application of U.S. application Ser. No. 07/637,390, filed Jan. 4, 1991 and entitled "Self-Aligned Window at Recessed Intersection of Insulating Regions", abandoned, which is a continuation of application Ser. No. 07/295,079, filed Jan. 9, 1989 and entitled "Self-Aligned Window at Recessed Intersection of Insulating Regions", now abandoned.

This application discloses subject matter also disclosed in application Ser. No. 07/219,529, filed Jul. 15, 1988, abandoned, and owned by the present Assignee.

BACKGROUND OF THE INVENTION

This invention relates to integrated circuit structures and processes and, in particular, to a self-aligned window formed at the recessed junction of two adjacent insulating regions formed on a surface of an integrated-circuit substrate.

Increasing the density of components on integrated circuit causes alignment of photo-masking processes to become more critical. Therefore, it is desirable to design structures and processes such that the number of critical photo-masking alignment steps is minimized.

SUMMARY OF THE INVENTION

The structure and process described in this invention eliminate one or more critical alignment steps for many integrated circuit processes. A first insulating region is formed on the surface of a semiconductor substrate in a manner such that the insulating region has at least one sloping edge. A second insulating region of field oxide is then formed on the surface adjacent a sloping edge of the first insulating region. The depression between two insulating regions is etched to form a window or a strip through to the substrate, the window or strip alternatively including a trench into the substrate. At least one of the insulating regions may be formed over a doped semiconductor region in the substrate. The other insulating region may be formed over a doped semiconductor region that is either of the same or of opposite type impurity as that of the first doped semiconductor region. Additional doping may be inserted in the window (and trench extension thereof, if applicable) to form a doped semiconductor insertion region. The lower surface and the walls of the window may be insulated. Whether or not the walls are insulated, the window may be filled with electrically conductive or electrically insulating material.

BRIEF DESCRIPTION OF THE DRAWINGS

The novel features of this invention are set forth in the appended claims. The invention, its features, and its advantages are described below in conjunction with the following drawings:

FIGS. 1(a)–1(g) are elevation views, in section, of typical embodiments of the structure of this invention at successive stages of manufacture, indicating alternative methods of construction.

DETAILED DESCRIPTION OF SPECIFIC EMBODIMENTS

Figure 2A:
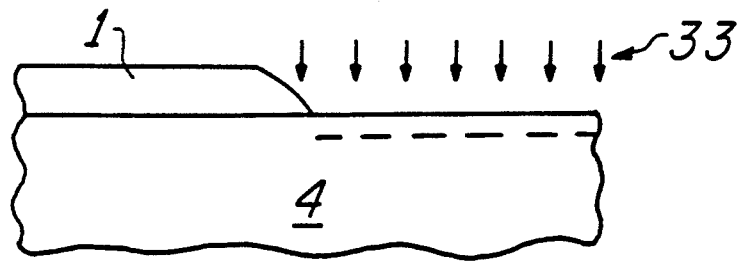
FIGS. 2(a)–2(d) are elevation views, in section, of a typical embodiment of the structure of this invention at successive stages of manufacture, indicating an alternative method of construction.
Figure 2B:
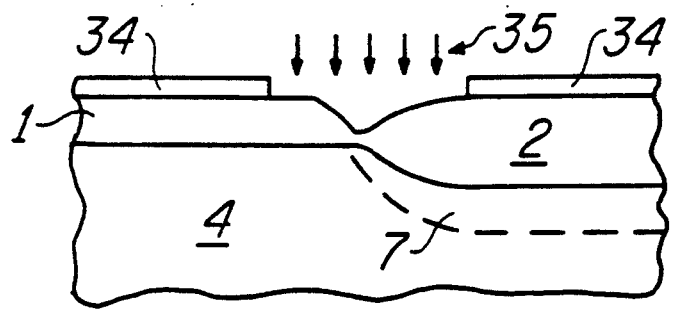
Figure 2C:
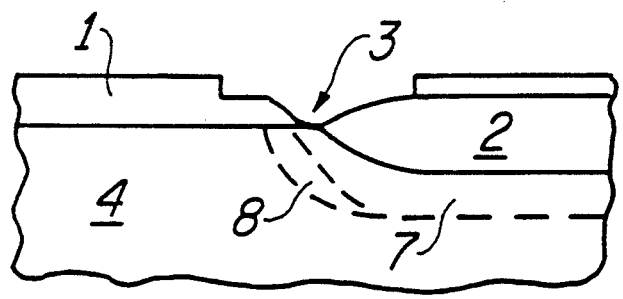
Figure 2D:
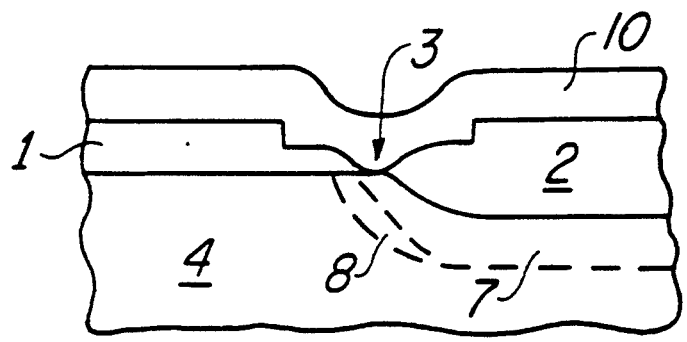

Referring to FIGS. 1(e), 1(g) and 2(d), the recessed junction of first insulating region 1 and second insulating region 2 has a window or strip 3 that extends from the upper surface of the insulator junction through the insulator junction at least to substrate 4. The window or strip 3 may extend into substrate 4, forming a trench extension 5 of window or strip 3 as shown in FIG. 1(g). An optional first doped semiconductor region 6 may be located under first insulating region 1. A second doped semiconductor region 7 may be located under second insulating region 2. An optional doped semiconductor insertion region 8 may be located in the substrate 4 below the window 3. While doped semiconductor insertion region 8 is shown as an extension of second doped semiconductor region 7, it may be an extension of first doped semiconductor region 6. The walls of window 3 and any trench extension 5 thereof may be covered with an electrically insulating material 9, such as oxide or nitride or a combination thereof, in at least the areas adjacent the substrate 4 or adjacent the optional conductive doped semiconductor regions 6, 7 or 8. The window 3, and/or any trench extension 5 thereof, may be filled with an electrically conductive material 10 that contacts at least one of substrate 4 and optional conductive doped semiconductor regions 6, 7 and 8, or is insulated from those regions by electrically insulating material 9.

A method of making the device of FIG. 1(e) will be described in reference to FIGS. 1(a)–1(e). The starting material is a slice of P-type silicon of which the substrate 4 is only a very small portion. The slice is perhaps 6 inches in diameter, while the portion shown in FIG. 1(a) is only a few microns wide. A number of process steps may be performed to create electronic components peripheral to the devices formed by the steps discussed here, and these will not be discussed here. The first step related to the structure of this invention may be applying a coating 31 that may include separate layers of oxide and silicon nitride, illustrated in FIG. 1(a), and patterning that coating 31 using photoresist to leave nitride over what will include second insulating region 2, while exposing the areas where first insulating region 1 is to be formed. A boron implant at about $8 \times 10^{12}$ cm$^{-2}$ may be performed if it is desired to create a channel-stop-type first doped semiconductor region 6 under first insulating region 1. An arsenic or phosphorus implant may be performed if it is desired to create a first doped region 6 with N-type doping. Then an oxide insulating region 1 may be grown to a thickness of perhaps 2000 Å to 9000 Å by exposing to an oxidizing agent such as steam at perhaps 900° C. for several hours, less time if arsenic is used for the optional doping step. The thermal oxide grows beneath the edges of the nitride 31, creating a "bird's beak" or sloped edge 32 in first insulating region 1 instead of a sharp transition.

Turning now to FIG. 1(b), the nitride 31 is removed and, in the area where the second insulating region 2 is to be formed, an arsenic implant 33, for example, may be performed at a dosage of about $6 \times 10^{15}$ cm$^{-2}$ at 100 KeV, using photoresist as an implant mask for regions where implant is not desired. Second oxide insulating region 2 is grown on the face to a thickness of perhaps 2000 to 3500 Å. With proper choices of doping material types, doping levels, edge slope, and relative exposure time to steam; a recessed area is formed at the junction of second insulating region 2 with the edge 32 of first insulating region 1. A layer 34 of photoresist may be formed on the structure and masked using non-critical alignment to expose the recessed area. The exposed area may be implanted with an impurity 35 if it is desired to create a doped semiconductor insertion region 8 under window 3. Depending on the application, optional doped semiconductor insertion region 8 may be of the same type doping as either doped semiconductor region 6 or doped semiconductor region 7. In the alternative, the implanting step may be performed after the next step.

In the alternative, doped semiconductor regions 6 or 7 may be formed by well-known double implantation of arsenic and phosphorous, for example. As is also well-known, certain types of doping, such as phosphorous, diffuse under window 3 to eliminate the need for separate implantation of impurity 35 to create optional doped semiconductor insertion region 8.

As shown in FIG. 1(c), a window 3 is opened in the junction between first insulating region 1 and second insulating region 2. The window 3 is opened using one of the well-known etching procedures for oxides and extends from the upper surface of the recessed junction through the thickness of the junction at least to the substrate 4.

Referring to FIG. 1(d), window 3 may be coated with an oxide or nitride insulator 9 in at least the surface areas of the window comprising doped semiconductor regions 6, 7 or 8. The window 3 may then be filled with electrically conductive material 10 such as polycrystalline silicon or aluminum, as illustrated in FIG. 1(e). The conductive material 10 may comprise a floating gate as described in U.S. patent application Ser. No. 07/219,529. Without optional insulator layer 9, conductive material 10 furnishes an electrical connection to at least one of doped semiconductor regions 6, 7 or 8.

FIG. 1(f) discloses an optional process step. In the procedure described, doped semiconductor insertion region 8 is absent and a second etching step is performed following the etching step described in reference to FIG. 2(d). The second etching step uses one of the well-known etching methods that absorb silicon substrate 4 rather than oxide, thereby forming a trench extension 5 of window 3. Trench extension 5 may insulate doped semiconductor region 6 from doped semiconductor region 7.

FIG. 1(g) illustrates that window 3, including optional trench extension 5, may be coated with an insulator 9 in at least the areas formed by doped semiconductor regions 6 and 7. The window 3 may then be filled with a conductive material 10 such as doped polycrystalline silicon (polysilicon), a silicided polysilicon, or aluminum to form a field-effect transistor if doped semiconductor regions 6 and 7 are of the same type.

An optional method of construction is shown in FIG. 2(a), illustrating that insulating region 1 may be formed of a chemically deposited material such as an oxide, or of layers of nitride and oxide. A sloped edge of insulating region 1 may be formed using masking and one of the well-known etching methods that absorb such oxide or nitride. For illustration purposes, optional doped semiconductor region 6 has been omitted from FIG. 2(a). Arsenic or similar doping 33 is inserted in the region adjacent to insulating region 1 with insulating region 1 serving as a mask. Implant energy may be similar to that described in reference to FIG. 1(a).

Referring to FIG. 2(b), insulating region 2 is formed as in the FIG. 1(b) by exposure to steam. With proper choice of dopants, doping levels, and edge slope; a recessed area is formed at the junction of insulating region 1 and insulating region 2. As in the explanation above, the recessed area may be masked by layer 34 of photoresist. An implantation 35 may be performed to create doped semiconductor insertion region 8.

As illustrated in FIG. 2(c), window 3 is etched through the junction. An optional layer 10 of conducting material formed to contact doped semiconductor region 7 or doped semiconductor insertion region 8 is shown in FIG. 2(d). Optional layer 10 may, of course, be separated from the semiconductor region 7 by an insulator in a manner similar to that of FIGS. 1(e) and 1(g).

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method of making a window between oxide insulating regions of an integrated circuit structure, comprising the steps of:
   forming on a semiconductor substrate a first oxide insulating region having a sloped wall;
   after forming said first oxide insulating region, growing a second oxide insulating region on the surface of said substrate, adjacent to said first oxide insulating region, such that said sloped wall and an edge of said second oxide insulating region form a recessed area;
   etching said recessed area such that opposing walls of said first oxide insulating region and said second oxide insulating region define a window region to the surface of said substrate.

2. The method of claim 1, further comprising the steps of doping the substrate under at least one of said oxide insulating regions prior to said growing step.

3. The method of claim 1, further comprising the step of continuing said etching step to form a trench in said substrate.

4. The method of claim 1, further comprising the step of doping the substrate under said window region after said window region is exposed.

5. The method of claim 1, further comprising the step of depositing an insulating layer over said window region.

6. The method of claim 1, wherein said first oxide insulating region is grown by exposure to steam.

7. The method of claim 1, wherein said second thick insulating region is grown by exposure to steam.

8. The method of claim 1, wherein said sloped wall is formed by depositing a silicon nitride layer on a substrate, patterning said nitride layer to expose a pattern of first insulating areas of said substrate, and forming the first oxide insulating region by growing said oxide such that a sloped wall is formed at the junction of said first oxide insulating region and said nitride layer.

9. The method of claim 1 wherein said sloped wall is formed by depositing said first oxide insulating region and etching an edge of said first oxide insulating region.

* * * * *